United States Patent
Dupont et al.

(10) Patent No.: US 10,177,288 B2
(45) Date of Patent: *Jan. 8, 2019

(54) OPTOELECTRONIC DEVICE COMPRISING LIGHT-EMITTING DIODES WITH IMPROVED LIGHT EXTRACTION

(71) Applicant: Aledia, Grenoble (FR)

(72) Inventors: Tiphaine Dupont, Grenoble (FR); Yohan Desieres, Lans en Vercors (FR)

(73) Assignees: Commissariat à l'Énergie Atomique et aux Énergies Alternatives, Paris (FR); Aledia, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/933,135

(22) Filed: Mar. 22, 2018

(65) Prior Publication Data

US 2018/0219143 A1 Aug. 2, 2018

Related U.S. Application Data

(63) Continuation of application No. 15/426,690, filed on Feb. 7, 2017, now Pat. No. 10,062,818, which is a
(Continued)

(30) Foreign Application Priority Data

Dec. 19, 2013 (FR) ...................... 13 63005

(51) Int. Cl.
*H01L 33/00* (2010.01)
*H01L 33/56* (2010.01)
(Continued)

(52) U.S. Cl.
CPC .......... *H01L 33/56* (2013.01); *H01L 25/0753* (2013.01); *H01L 27/153* (2013.01); *H01L 27/156* (2013.01); *H01L 33/0008* (2013.01); *H01L 33/0075* (2013.01); *H01L 33/06* (2013.01); *H01L 33/08* (2013.01); *H01L 33/145* (2013.01); *H01L 33/20* (2013.01); *H01L 33/24* (2013.01); *H01L 33/32* (2013.01);
(Continued)

(58) Field of Classification Search
None
See application file for complete search history.

(56) References Cited

U.S. PATENT DOCUMENTS 9,601,543 B2 * 3/2017 Dupont .................. H01L 33/24
2011/0254034 A1 10/2011 Konsek et al.
(Continued)

OTHER PUBLICATIONS

International Search Report for Application No. PCT/EP2014/077418 dated Feb. 12, 2015.
(Continued)

*Primary Examiner* — Minh-Loan Tran
(74) *Attorney, Agent, or Firm* — Wolf, Greenfield & Sacks, P.C.

(57) ABSTRACT

An optoelectronic device including a semiconductor substrate having a face, light-emitting diodes arranged on the face and including wired conical or frustoconical semiconductor elements, and an at least partially transparent dielectric layer covering the light-emitting diodes, the refractive index of the dielectric layer being between 1.6 et 1.8.

12 Claims, 3 Drawing Sheets

Related U.S. Application Data continuation of application No. 15/101,887, filed as application No. PCT/EP2014/077418 on Dec. 11, 2014, now Pat. No. 9,601,543.

(51) Int. Cl.

| | | |
|---|---|---|
| *H01L 33/54* | (2010.01) | |
| *H01L 33/52* | (2010.01) | |
| *H01L 33/08* | (2010.01) | |
| *H01L 33/24* | (2010.01) | |
| *H01L 27/15* | (2006.01) | |
| *H01L 33/32* | (2010.01) | |
| *H01L 25/075* | (2006.01) | |
| *H01L 33/06* | (2010.01) | |
| *H01L 33/14* | (2010.01) | |
| *H01L 33/20* | (2010.01) | |
| *H01L 33/42* | (2010.01) | |
| *H01L 33/46* | (2010.01) | |
| *H01L 33/58* | (2010.01) | |
| *H01L 33/44* | (2010.01) | |

(52) U.S. Cl.
CPC .............. *H01L 33/42* (2013.01); *H01L 33/46* (2013.01); *H01L 33/52* (2013.01); *H01L 33/54* (2013.01); *H01L 33/44* (2013.01); *H01L 33/58* (2013.01)

(56) References Cited

U.S. PATENT DOCUMENTS

| | | |
|---|---|---|
| 2013/0307960 A1 | 11/2013 | Bahm et al. |
| 2013/0313589 A1 | 11/2013 | Tomizawa et al. |
| 2013/0341658 A1 | 12/2013 | Lee et al. |
| 2014/0077156 A1 | 3/2014 | Bavencove et al. |
| 2015/0144873 A1 | 5/2015 | Hwang et al. |
| 2016/0300978 A1 | 10/2016 | Kim et al. |
| 2016/0300983 A1 | 10/2016 | Strassburg et al. |
| 2016/0307960 A1 | 10/2016 | Dupont et al. |
| 2017/0148960 A1 | 5/2017 | Dupont et al. |

OTHER PUBLICATIONS

Translation of the Written Opinion of the International Searching Authority, dated May 3, 2016, from corresponding International Application No. PCT/EP2014/077418.

Cheng et al., Atomic layer deposition enabled interconnect technology for vertical nanowire arrays. (2001) Sensors and Actuators; vol. 165(1) pp. 107-114.

Liu et al., Status and prospects for phosphor-based white LED packaging. (2009) Front. Optoelectron; vol. 2(2) pp. 119-140.

Mont et al., High-refractive-index TiO2-nanoparticle-loaded encapsulates for light emitting diodes. (2008) J. Appl. Phys.; vol. 103.

* cited by examiner

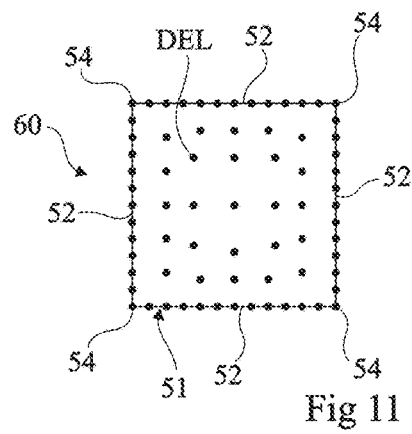
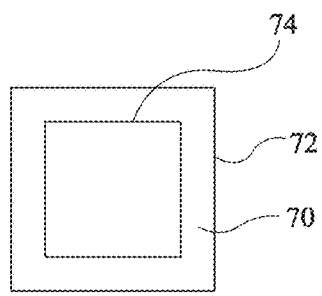
Fig 11　　　　　　　　　Fig 12
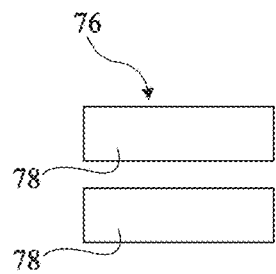
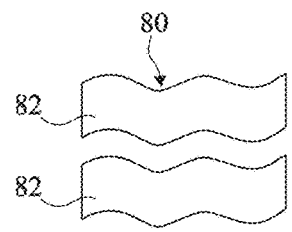
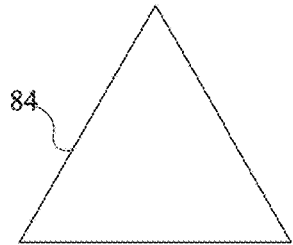
Fig 13　　　　　Fig 14　　　　　Fig 15
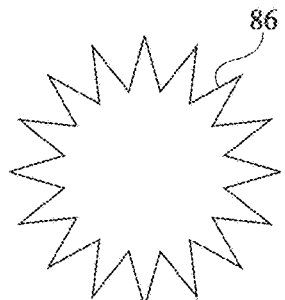
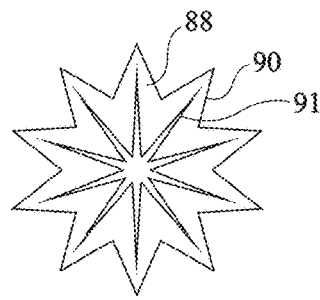
Fig 16　　　　　　　　　Fig 17
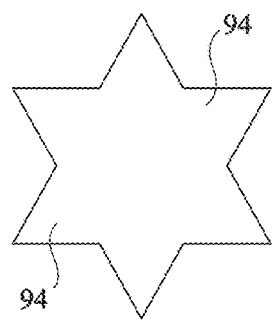
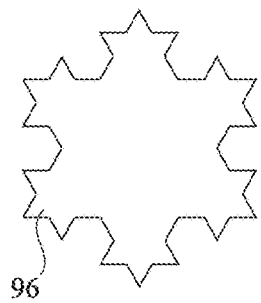
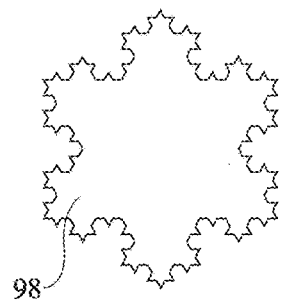
Fig 18　　　　　Fig 19　　　　　Fig 20

US 10,177,288 B2

OPTOELECTRONIC DEVICE COMPRISING LIGHT-EMITTING DIODES WITH IMPROVED LIGHT EXTRACTION

CROSS-REFERENCE TO RELATED APPLICATIONS

This Application is a Continuation of application Ser. No. 15/426,690, filed Feb. 7, 2017, which is a Continuation of application Ser. No. 15/101,887, filed Jun. 3, 2016, which is the national stage filing under 35 U.S.C. 371 of International Patent Application Serial No. PCT/EP2014/077418, filed Dec. 11, 2014, which claims priority to French application No. 13/63005, filed Dec. 19, 2013. The entire contents of these applications are incorporated herein by reference in their entirety to the maximum extent allowable.

BACKGROUND

The present invention generally relates to optoelectronic devices based on semiconductor materials and to methods for manufacturing the same. The present invention more specifically relates to optoelectronic devices comprising light-emitting diodes formed by three-dimensional elements, particularly semiconductor microwires or nanowires.

DISCUSSION OF THE RELATED ART

The term "optoelectronic devices with light-emitting diodes" designates devices capable of converting an electric signal into an electromagnetic radiation, and particularly devices dedicated to the emission of an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter.

The extraction efficiency of an optoelectronic device is generally defined by the ratio of the number of photons escaping from the optoelectronic device to the number of photons emitted by the light-emitting diodes. It is desirable for the extraction efficiency of an optoelectronic device to be as high as possible.

A disadvantage of existing optoelectronic devices is that a fraction of the photons emitted within each light-emitting diode does not escape from the light-emitting diode.

Another disadvantage of existing optoelectronic devices is that a portion of the light emitted by each light-emitting diode is trapped or absorbed by the neighboring light-emitting diodes.

SUMMARY

Thus, an object of an embodiment is to overcome at least part of the disadvantages of previously-described optoelectronic devices with light-emitting diodes, particularly with microwires or nanowires, and of their manufacturing methods.

Another object of an embodiment is to increase the extraction efficiency of the optoelectronic device.

Another object of an embodiment is to decrease the proportion of light which does not escape from each light-emitting diode.

Another object of an embodiment is to decrease the proportion of light emitted by a light-emitting diode which is absorbed/trapped by neighboring light-emitting diodes.

Another object of an embodiment is for optoelectronic devices with light-emitting diodes to be capable of being manufactured at an industrial scale and at a low cost.

Thus, an embodiment provides an optoelectronic device comprising:

a semiconductor substrate comprising a surface;

light-emitting diodes supported by the surface and comprising wire-shaped, conical, or tapered semiconductor elements; and an at least partially transparent dielectric layer covering the light-emitting diodes, the refractive index of the dielectric layer being in the range from 1.6 to 1.8.

According to an embodiment, the refractive index of the dielectric layer is in the range from 1.7 to 1.75.

According to an embodiment, each semiconductor element is mainly made of a III-V compound.

According to an embodiment, each semiconductor element mainly comprises gallium nitride.

According to an embodiment, the mean diameter of each semiconductor element is in the range from 200 nm to 1 µm.

According to an embodiment, the encapsulation layer comprises a matrix made of a first at least partially transparent material having particles of a second material spread therein, the refractive index of the second material being greater than the refractive index of the first material.

According to an embodiment, the first material is a polysiloxane.

According to an embodiment, the second material is a dielectric material selected from among titanium oxide ($TiO_2$), zirconium oxide ($ZrO_2$), and zinc sulfide (ZnS).

According to an embodiment, the encapsulation layer is made of a material selected from the group comprising epoxide polymers, silicon oxides of $SiO_x$ type, where x is a real number greater than 0 and smaller than or equal to 2, silicon oxides of $SiO_yN_z$ type, where y is a real number greater than 0 and smaller than or equal to 2 and z is greater than 0 and smaller than or equal to 0.57, and aluminum oxide ($Al_2O_3$).

According to an embodiment, the light-emitting diodes are distributed on a portion of the surface and the surface density of light-emitting diodes on the portion decreases away from the edges of said portion.

According to an embodiment, the light-emitting diodes are distributed on a portion of the surface and the ratio of the perimeter of said portion to the surface area of said portion is greater than or equal to 4 for a unit surface area.

According to an embodiment, the portion corresponds to a surface with a hole.

BRIEF DESCRIPTION OF THE DRAWINGS

The foregoing and other features and advantages will be discussed in detail in the following non-limiting description of specific embodiments in connection with the accompanying drawings, among which:

FIGS. 11 to 20 are partial simplified top views of embodiments of optoelectronic devices comprising light-emitting diodes with microwires or nanowires.

DETAILED DESCRIPTION

Figure 1:
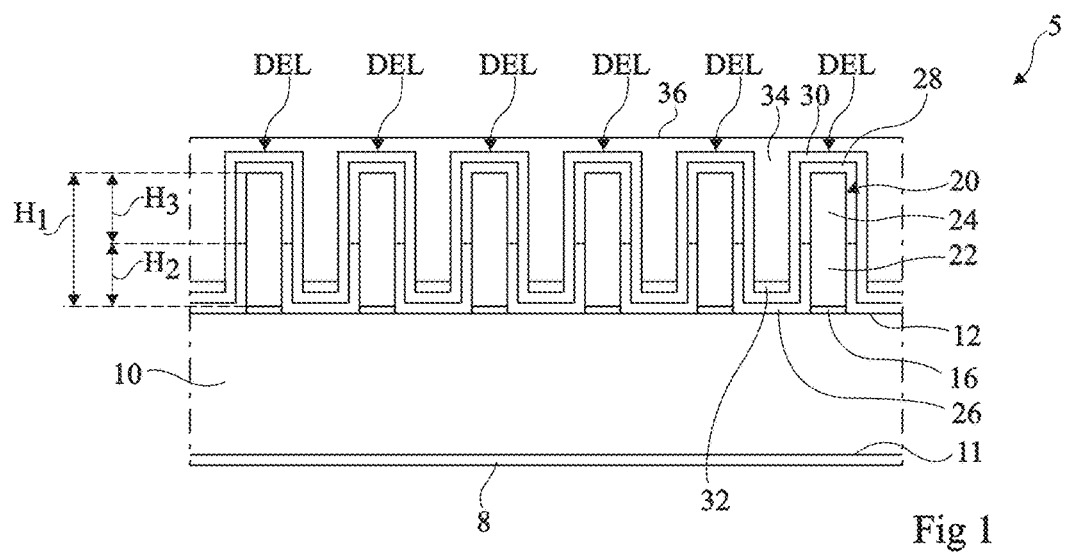
FIG. 1 is a partial simplified cross-section view of an embodiment of an optoelectronic device with microwires or nanowires.

For clarity, the same elements have been designated with the same reference numerals in the various drawings and, further, as usual in the representation of electronic circuits, the various drawings are not to scale. Further, only those elements which are useful to the understanding of the present disclosure have been shown and are described. In particular, the means for biasing the light-emitting diodes of an optoelectronic device are well known and will not be described.

In the following description, unless otherwise indicated, the terms "substantially", "approximately", and "in the order of" mean "to within 10%". Further, "compound mainly formed of a material" or "compound based on a material" means that a compound comprises a proportion greater than or equal to 95% of said material, this proportion being preferentially greater than 99%.

The present description relates to optoelectronic devices with three-dimensional elements, for example, wire-shaped, conical, or tapered elements, particularly microwires or nanowires.

The term "microwire" or "nanowire" designates a three-dimensional structure having an elongated shape along a preferential direction with at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, the term "wire" is used to mean "microwire or nanowire". Preferably, the mean line of the wire which runs through the centers of gravity of the cross-sections, in planes perpendicular to the preferential direction of the wire, is substantially rectilinear and is called "axis" of the wire hereafter.

FIG. 1 is a partial simplified cross-section view of an embodiment of an optoelectronic device 5 with light-emitting diodes.

FIG. 1 shows a structure comprising, from bottom to top:
a first electrode 8;
a semiconductor substrate 10 comprising a lower surface 11 and an upper surface 12, lower surface 11 being covered with first electrode 8 and upper surface 12 being preferably planar at least at the level of the light-emitting diodes;
seed pads 16 made of a conductive material promoting the growth of wires and arranged on surface 12;
wires 20 (six wires being shown) of height H1, each wire 20 being in contact with one of seed pads 16, each wire 20 comprising a lower portion 22, of height H2, in contact with seed pad 16 and an upper portion 24, of height H3, continuing lower portion 22;
an insulating layer 26 extending on surface 12 of substrate 10 and on the lateral sides of lower portion 22 of each wire 20;
a shell 28 comprising a stack of semiconductor layers covering each upper portion 24;
a layer 30 forming a second electrode covering each shell 28 and further extending on insulating layer 26;
a conductive mirror layer 32 covering electrode layer 30 between wires 20 without extending on wires 20; and
an encapsulation layer 34 covering the entire structure and particularly electrode 30 and comprising a front surface 36.

Optoelectronic device 5 may further comprise a layer of phosphors, not shown, provided on encapsulation layer 34 or confounded therewith.

The assembly formed by each wire 20, the associated seed pad 16, and shell 28 forms a light-emitting diode DEL. The base of diode DEL corresponds to seed pad 16. Shell 28 particularly comprises an active layer which is the layer from which most of the electromagnetic radiation delivered by light-emitting diode DEL is emitted. Light-emitting diodes DEL may be connected in parallel and form an assembly of light-emitting diodes. The assembly may comprise from a few light-emitting diodes DEL to one thousand light-emitting diodes.

It is possible for light-emitting diodes DEL not to be formed over the entire surface 12. The portion of surface 12 having light-emitting diodes formed thereon is called the active area.

Substrate 10 may correspond to a solid structure or correspond to a layer covering a support made of another material. Substrate 10 is preferably a semiconductor substrate, for example, a substrate made of silicon, of germanium, of silicon carbide, of a III-V compound, such as GaN or GaAs, or a ZnO substrate. Preferably, substrate 10 is a single-crystal silicon substrate. Preferably, it is a semiconductor substrate compatible with manufacturing methods implemented in microelectronics. Substrate 10 may correspond to a multilayer structure of silicon on insulator type, SOI.

The substrate may be heavily doped, lightly doped or non-doped. In the case where the substrate is heavily doped, semiconductor substrate 10 may be doped to lower the electric resistivity down to a resistivity close to that of metals, preferably lower than a few mohm·cm. Substrate 10 for example is a heavily-doped substrate having a dopant concentration in the range from $5*10^{16}$ atoms/cm3 to $2*10^{20}$ atoms/cm3. In the case where the substrate is lightly doped, for example, with a dopant concentration smaller than or equal to $5*10^{16}$ atoms/cm3, preferably substantially equal to $10^{15}$ atoms/cm3, a doped region of the first conductivity type or of a second conductivity type, opposite to the first type, more heavily doped than the substrate, may be provided, which extends in substrate 10 from surface 12 under seed pads 16. In the case of a silicon substrate 10, examples of P-type dopants are boron (B) or indium (In) and examples of N-type dopants are phosphorus (P), arsenic (As), or antimony (Sb).

Surface 12 of silicon substrate 10 may be a (100) surface.

Seed pads 16, also called seed islands, are made of a material promoting the growth of wires 20. A treatment may be provided to protect the lateral sides of the seed pads and the surface of the substrate portions which are not covered with the seed pads to prevent the wires from growing on the lateral sides of the seed pads and on the surface of the substrate portions which are not covered with the seed pads. The treatment may comprise forming a dielectric region on the lateral sides of the seed pads and extending on top of and/or inside of the substrate, with no wire growth on the dielectric region. As a variation, seed pads 16 may be replaced with a seed layer covering surface 12 of substrate 10. A dielectric region may then be formed above the seed layer to prevent the growth of wires in unwanted areas.

As an example, the material forming seed pads 16 may be a nitride, a carbide, or a boride of a transition metal from column IV, V, or VI of the periodic table of elements or a combination of these compounds. As an example, seed pads 16 may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate (ZrB2), zirconium nitride (ZrN), silicon carbide (SiC), tantalum carbo-nitride (TaCN), magnesium nitride in MgxNy form, where x is approximately equal to 3 and y is approximately equal to 2, for example, magnesium nitride in Mg3N2 form or magnesium gallium nitride (MgGaN), tungsten (W), tungsten nitride (WN), or a combination thereof.

Seed pads 16 may be doped with the same conductivity type as substrate 10.

Insulating layer 26 may be made of a dielectric material, for example, of silicon oxide (SiO2), silicon nitride (SixNy, where x is approximately equal to 3 and y is approximately equal to 4, for example, Si3N4), silicon oxynitride (particularly of general formula SiOxNy, for example, Si2ON2), aluminum oxide (Al2O3), hafnium oxide (HfO2), or diamond. As an example, the thickness of insulating layer 26 is in the range from 5 nm to 500 nm, for example, equal to approximately 30 nm.

Wires 20 are at least partly formed from at least one semiconductor material. Wires 20 may be at least partly formed from semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Wires 20 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 20 may have different shapes, such as, for example, a shape which may be oval, circular, or polygonal, particularly triangular, rectangular, square, or hexagonal. It should thus be understood that the term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. Height H1 of each wire 20 may be in the range from 250 nm to 50 µm. Each wire 20 may have an elongated semiconductor structure along an axis substantially perpendicular to surface 12. Each wire 20 may have a general cylindrical shape. The axes of two wires 20 may be distant by from 0.5 µm to 10 µm, and preferably from 1.5 µm to 6 µm. As an example, wires 20 may be regularly distributed, particularly in a hexagonal network.

As an example, lower portion 22 of each wire 20 is mainly formed of the III-N compound, for example, gallium nitride, of same doping type as region 14, for example, type N, for example, silicon-doped. Lower portion 22 extends along a height H2 which may be in the range from 100 nm to 25 µm.

As an example, upper portion 24 of each wire 20 is at least partially made of a III-N compound, for example, GaN. Upper portion 24 may be N-type doped, possibly less heavily doped than lower portion 22, or not be intentionally doped. Upper portion 24 extends along a height H3 which may be in the range from 100 nm to 25 µm.

Shell 28 may comprise a stack of a plurality of layers, particularly comprising:
    an active layer covering upper portion 24 of the associated wire 20;
    an intermediate layer having a conductivity type opposite to that of lower portion 22 covering the active layer; and
    a bonding layer covering the intermediate layer and covered with electrode 30.

The active layer is the layer from which most of the radiation delivered by light-emitting diode DEL is emitted. According to an example, the active layer may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

The intermediate layer, for example, P-type doped, may correspond to a semiconductor layer or to a stack of semiconductor layers and allows the forming of a P-N or P-I-N junction, the active layer being comprised between the intermediate P-type layer and upper N-type portion 24 of the P-N or P-I-N junction.

The bonding layer may correspond to a semiconductor layer or to a stack of semiconductor layers and enables to form an ohmic contact between the intermediate layer and electrode 30. As an example, the bonding layer may be very heavily doped, of a type opposite to that of lower portion 22 of each wire 20, until degeneration of the semiconductor layer(s), for example, P-type doped at a concentration greater than or equal to 1020 atoms/cm3.

The stack of semiconductor layers may comprise an electron barrier layer formed of a ternary alloy, for example, made of aluminum gallium nitride (AlGaN) or of aluminum indium nitride (AlInN) in contact with the active layer and the intermediate layer, to provide a good distribution of electric carriers in the active layer.

Electrode 30 is capable of biasing the active layer of each wire 20 and of letting through the electromagnetic radiation emitted by light-emitting diodes DELs. The material forming electrode 30 may be a transparent and conductive material such as indium tin oxide (ITO), aluminum-doped zinc oxide, or graphene. As an example, electrode layer 30 has a thickness in the range from 5 nm to 200 nm, preferably from 20 nm to 50 nm.

Conductive mirror layer 32 preferably corresponds to a metal layer, for example, made of aluminum, silver, copper, or zinc. As an example, conductive mirror layer 32 has a thickness in the range from 20 nm to 300 nm, preferably from 100 nm to 200 nm.

Encapsulation layer 34 is made of an at least partially transparent insulating material. The maximum thickness of encapsulation layer 34 is greater than height H1 of wires 20. Encapsulation layer 34 extends between wires 20 and covers each wire 20. The space between wires 20 is totally filled with encapsulation layer 34. The maximum thickness of encapsulation layer 34 is in the range from 250 nm to 50 μm so that encapsulation layer 34 fully covers electrode 30 at the top of light-emitting diodes DEL.

The active layer of shell 28 of each light-emitting diode DEL emits light in all directions.

FIGS. 2 to 6 illustrate the paths traveled by light rays R for different light emission configurations. In FIGS. 2 to 6, layers 30, 32, and 34 have not been shown. Call θ the angle formed by light ray R relative to direction D perpendicular to the lateral walls of wire 20 and θC the critical total reflection angle of the assembly comprising wire 20 and the active layer of shell 28.

Figure 2:
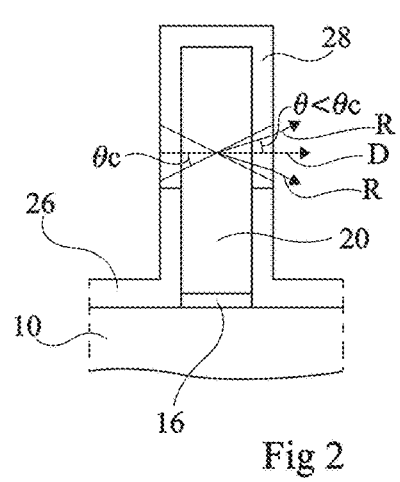
FIGS. 2 to 6 illustrate different configurations of paths followed by light rays in microwires or nanowires.
Figure 3:
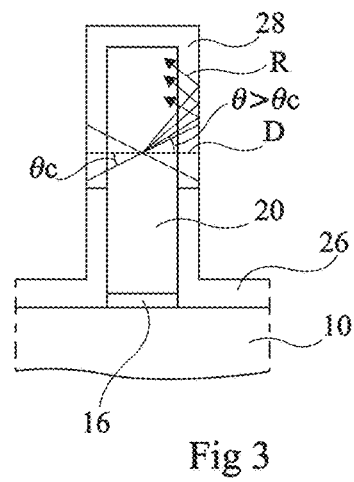
Figure 4:
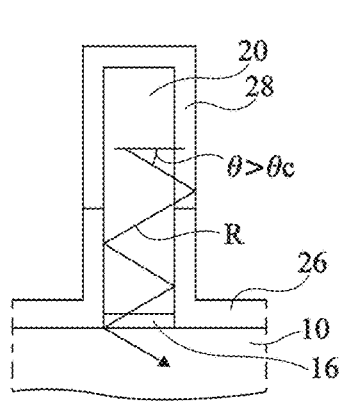
Figure 5:
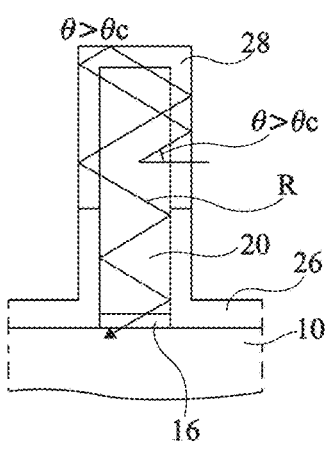

According to emission angle θ, the light emitted by the active layer of shell 28 may either couple to a radiated mode called RL, as illustrated in FIG. 2, or to a guided mode called GL, as illustrated in FIG. 3. Guided modes GL have an emission angle θ greater than critical total reflection angle θC and propagating in zigzag along wire 20. Conversely, radiated modes RL have an emission angle θ smaller than critical total reflection angle θC and are totally transmitted in encapsulation layer 34.

Critical total reflection angle θC is provided by Snell's law according to the following relation (1):

$$\theta C = a\sin(n\text{encap}/n\text{wire}) \tag{1}$$

where nencap is the real part of the optical refractive index of encapsulation layer 34 and nwire is the real part of the optical refractive index of wire 20 and of its shell 28, nwire being greater than nencap.

The optical refractive index is a dimensionless number which characterizes the optical properties of a medium, particularly the absorption and the diffusion. The refractive index is equal to the real part of the complex optical index. The refractive index may for example be determined by ellipsometry.

Figure 6:
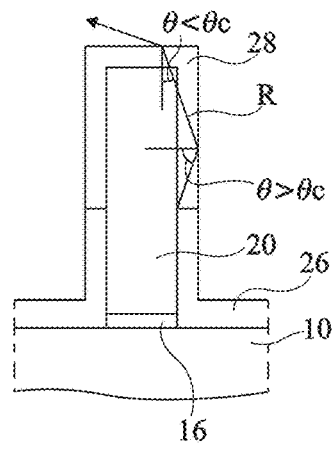

Under angle of incidence θ, guided modes GL break up into modes lost in the substrate SGL (FIG. 4), into reflected modes RGL (FIG. 5) and transmitted modes TGL (FIG. 6). Modes SGL are guided to the base of wire 20 and lost in substrate 10. Modes TGL have an angle of incidence at the upper face of wire 20 which is smaller than the critical total reflection angle and are thus transmitted in encapsulation layer 34. Modes RGL are in total reflection condition at the upper face and are sent back towards the base of wire 20 without being extracted.

Among guided modes GL, only transmitted guided modes TGL take part in the light perceived by an observer. The modes guided towards the substrate, SGL, are directly lost and reflected modes RGL remain trapped inside of wire 20 until they are absorbed or lost in substrate 10.

Figure 7:
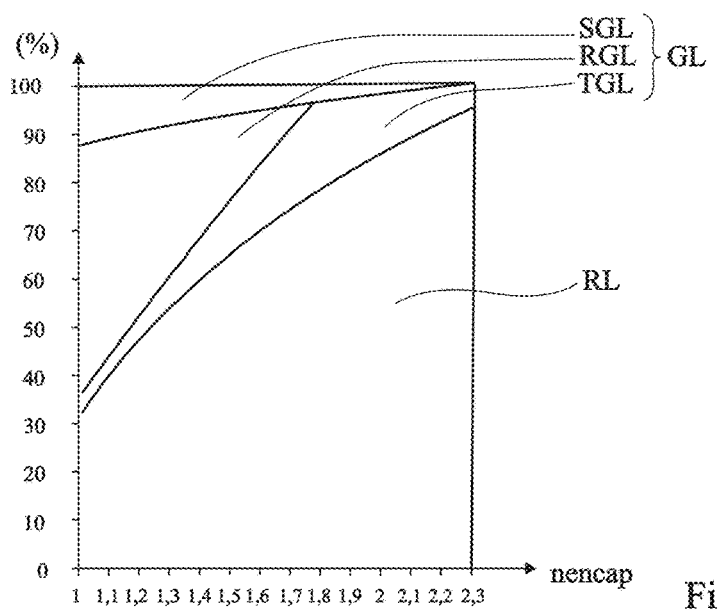
FIG. 7 shows the variation of the distribution of the propagation modes of the light delivered by a light-emitting diodes with microwires or nanowires according to the refractive index of the material surrounding the light-emitting diode.

FIG. 7 shows the proportion of modes RL, GL, SGL, RGL, and TGL according to refractive index nencap of encapsulation layer 34. The proportion of light extracted from the light-emitting diode is the sum of proportions RL and TGL.

Figure 8:
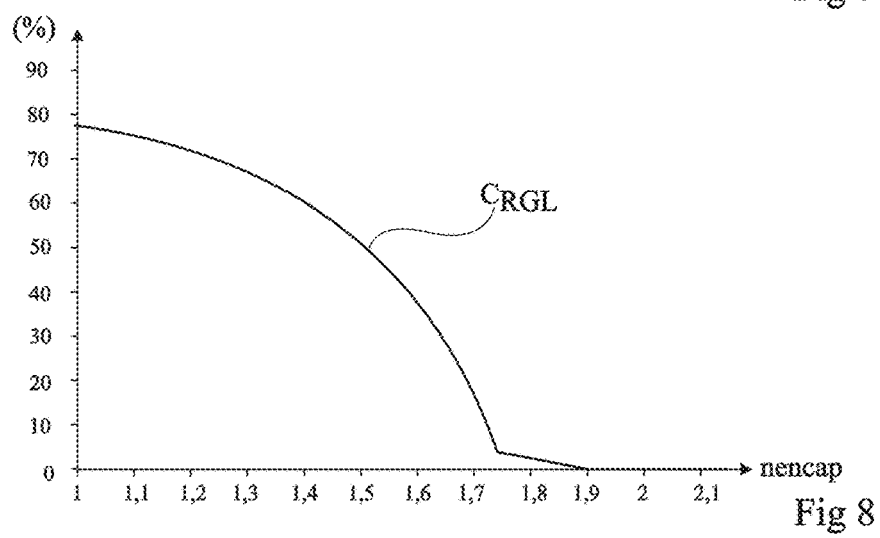
FIG. 8 shows a curve of the variation of the proportion of trapped guided modes in a microwire or nanowire of a light-emitting diode according to the refractive index of the material surrounding the light-emitting diode.

FIG. 8 shows a variation curve CRGL corresponding to the proportion of guided modes RGL relative to the total number of guided modes GL according to refractive index nencap of encapsulation layer 34. The curves of FIGS. 7 and 8 have been obtained in the case of a GaN wire of hexagonal cross-section having a mean diameter of 800 nm and a shell having a 275-nm thickness.

The proportion of radiated modes, RL, increases while the proportion of guided modes, GL, decreases as the refractive index of encapsulation layer 34 increases. Further, the proportion of trapped guided light RGL decreases to become zero for a refractive index of encapsulation layer 34 equal to approximately 1.73.

By simulation, the inventors have shown that the shape of the curves of variation of the proportions of modes RL, GL, SGL, RGL, and TGL is substantially the same independently from the mean diameter of wire 20, as soon as the mean diameter of wire 20 is greater than 200 nm. In particular, the refractive index at which propagation mode RGL cancels is substantially independent from the mean diameter of wire 20, as soon as the mean diameter of wire 20 is greater than 200 nm.

To be perceived by an observer watching optoelectronic device 5, the light should leave encapsulation layer through front surface 36. Surface 36 may correspond to a free surface, that is, in contact with air. The greater the difference between the refractive index of encapsulation layer 34 and the index of air, the lower the critical total reflection angle, measured relative to a direction perpendicular to surface 36, that is, the more the light originating from light-emitting diodes DEL tends to reflect on surface 36. It is thus not desirable for the refractive index of encapsulation layer 34 to be too high.

When the material forming the wires and the active layers is a III-V compound, the inventors have shown by simulation that the best compromise can be obtained with a refractive index of encapsulation layer 34 in the range from 1.7 to 1.75, preferably in the range from 1.72 to 1.74, more preferably of approximately 1.73.

Preferably, the mean diameter of wire 20 is in the range from 200 nm to 1 μm, preferably from 300 nm to 800 nm.

Encapsulation layer 34 may comprise a matrix of an at least partially transparent inorganic material having particles of a dielectric material possibly spread therein. The refractive index of the dielectric material forming the particles is greater than the refractive index of the material forming the matrix. According to an example, encapsulation layer 34 comprises a matrix made of silicone, also called polysiloxane, and further comprises particles of a dielectric material spread in the matrix. The particles are made of any type of material providing relatively spherical nanometer-range particles having an adapted refractive index. As an example, the particles may be made of titanium oxide (TiO2), zirconium oxide (ZrO2), zinc sulfide (ZnS), lead sulfide (PbS), or amorphous silicon (Si). The mean diameter of a is defined as being the diameter of the sphere of same volume. The mean diameter of the particles of the dielectric material is in the range from 2 nm to 250 nm. The volume concentration of particles with respect to the total weight of encapsulation layer 34 is in the range from 1% to 50%.

According to another example, the inorganic material is selected from the group comprising epoxide polymers, silicon oxides of SiOx type, where x is a real number greater than 0 and smaller than or equal to 2, silicon oxides of SiOyNz type, where y is a real number greater than 0 and smaller than or equal to 2 and z is greater than 0 and smaller than or equal to 0.57, and aluminum oxide (Al2O3).

Encapsulation layer 34 may be made of an at least partially transparent organic material. According to an example, encapsulation layer 34 is made of polyimide. According to another example, encapsulation layer 34 is made of an epoxide polymer which further comprises particles of a dielectric material distributed in the matrix. The particles may be made of titanium oxide (TiO2), zirconium oxide (ZrO2), zinc sulfide (ZnS), lead sulfide (PbS), or amorphous silicon (Si).

To improve the extraction efficiency of optoelectronic device 5, a surface treatment, called texturing, may be applied to surface 36 of encapsulation layer 34 to form raised areas on surface 36. For an encapsulation layer 34 made of an inorganic material, the method of texturing surface 36 may comprise a step of chemical etching or a step of mechanical abrasion, possibly in the presence of a mask protecting portions of surface 36 treated to promote the forming of patterns at the surface. For a layer 34 made of an organic material, the method of texturing surface 36 may comprise a step of embossing, moulding, etc.

To improve the extraction efficiency of optoelectronic device 5, encapsulation layer 34 may be covered with an at least partially transparent additional layer. The refractive index of the additional layer is then between the refractive index of encapsulation layer 34 and the refractive index of air. As a variation, a stack of at least two layers may cover encapsulation layer 34. The refractive indexes of the layers in the stack decrease from the first layer of the stack in contact with encapsulation layer 34 to the last layer of the stack in contact with air, the refractive index of the first layer being smaller than the refractive index of encapsulation layer 34 and the refractive index of the last layer being greater than the refractive index of air.

The optoelectronic device according to the previously-described embodiment enables to advantageously increase the general extraction efficiency of the optoelectronic device, that is, the efficiency measured over the entire surface 36.

The extraction efficiency may be measured locally, that is, for a portion of surface 36. It then corresponds to the ratio of the quantity of light which escapes from the optoelectronic device through the considered portion to the quantity of light delivered by the light-emitting diodes of this portion. It is desirable for the variations of the local extraction efficiency over the entire surface 36 to be as low as possible to avoid for an observer to perceive luminance differences when watching optoelectronic device 5.

Figure 9:
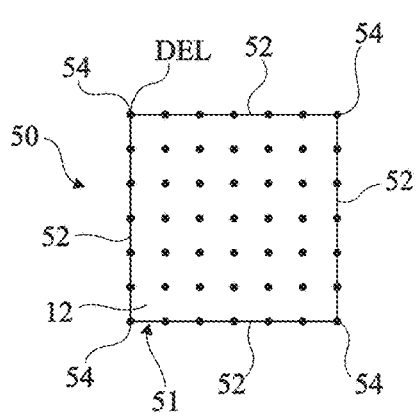
FIG. 9 is a partial simplified top view of an optoelectronic device comprising light-emitting diodes with microwires or nanowires.

FIG. 9 is a top view of an example of optoelectronic device 50, comprising all the elements of optoelectronic device 5 shown in FIG. 1 and having light-emitting diodes DEL regularly distributed therein, for example, in rows and in columns, on a square active area 51. The lateral edges of active area 51 are designated with reference numeral 52 and the corners of active area 51 are designated with reference numeral 54. Each light-emitting diode is schematically shown as a point. As an example, except for the diodes located along edges 52, each light-emitting diode DEL is located at the center of a square comprising a light-emitting diode at each apex and a light-emitting diode in the middle of each edge.

In the example shown in FIG. 9, the density of light-emitting diodes per surface area unit is substantially constant over the entire active area 51. As an example, the surface density of light-emitting diodes is substantially constant and in the range from 4*106/cm2 to 3*107/cm2.

Figure 10:
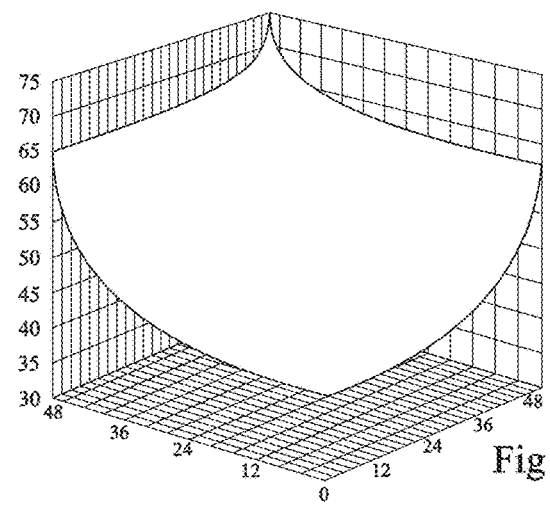
FIG. 10 shows the variations of the extraction efficiency according to the considered position on the front surface of the optoelectronic device of FIG. 9.

FIG. 10 shows the variation of the local extraction efficiency of optoelectronic device 50 of FIG. 9 over one quarter of active area 51. The curve of FIG. 10 has been obtained in the case of an array of GaN nanowires of hexagonal cross-section, the distance between the axes of two nanowires being 3 times the mean radius of shell 28 and the refractive index of the material of encapsulation layer 34 being equal to 1.75.

The local extraction efficiency is greater along edges 52 than at the center of active area 51. Further, the local extraction efficiency is greater at apexes 54 than on edges 52 of active area 51. The explanation of this phenomenon is that the larger the number of close neighbors of a light-emitting diode, the higher the probability for the light rays emitted by this light-emitting diode to hit one of the neighboring light-emitting diodes and to be absorbed or trapped by said neighbors.

By simulation, the inventors have shown a decrease in the extraction efficiency as soon as the distance between the axes of two adjacent light-emitting diodes is smaller than 15 times the mean radius of shell 28.

For distances between the axes of adjacent light-emitting diodes smaller than 15 times the mean radius of shell 28, it has been observed that the extraction efficiency of the center of active area 51 reaches a minimum value independent from the number of rows and columns when the number of rows and columns is greater than approximately 50.

FIG. 11 is a view similar to FIG. 9 of an embodiment of an optoelectronic device 60. Optoelectronic device 60 comprises all the elements of optoelectronic device 50, with the difference that the density of light-emitting diodes per surface area unit gradually increases from the center of the device all the way to edges 52. More particularly, the surface density of light-emitting diodes at the center of active area 51 is smaller than the surface density of light-emitting diodes along edges 52. Further, the surface density of light-emitting diodes along edges 52 is smaller than the surface density of light-emitting diodes at apexes 54 of active area 51.

As an example, the variation of the surface density of light-emitting diodes may correspond to the inverse of the variation of the extraction efficiency such as shown in FIG. 10. As an example, the surface density of light-emitting diodes at the center of the active area of the optoelectronic device may be in the range from 2*106/cm2 to 6*106/cm2 while the surface density of light-emitting diodes along an edge of the active area of the optoelectronic device may be in the range from 7*106/cm2 to 2*107/cm2.

According to another embodiment, the inventors have shown that the uniformity of the extraction efficiency can be improved by increasing the ratio of the perimeter of the active area to the surface of the active area. Preferably, ratio P/A of the perimeter to the surface of the active area is greater than 4 for a unit active surface area, preferably greater than or equal to 4.5, more preferably greater than or equal to 5, and particularly greater than or equal to 6.

FIGS. 12 to 20 show simplified top views of embodiments of optoelectronic devices for each of which only the contour of the active area has been shown. For each of these examples, the ratio of the perimeter of the active area to the surface area of the active area is greater than that obtained for a square of same surface area.

In FIG. 12, active area 70 has a ring shape comprising a square external edge 72 and a square internal edge 74. In FIG. 13, active area 76 comprises one or more than one rectangular area 78, two rectangular areas being shown. In FIG. 14, active area 80 comprises one or more than one strip 82 with wavy edges, two strips 82 being shown. In FIG. 15, active area 84 has a triangular shape. In FIG. 16, active area 86 is star-shaped. In FIG. 17, active area 88 comprises a star-shaped outer edge 90 and a star-shaped inner edge 91. Advantageously, the outer perimeter, and possibly the inner perimeter, of the active area follow a curve which is close to a fractal curve. In FIGS. 18, 19, and 20, active areas 94, 96, and 98 respectively have the shape of a Koch snowflake after two, three, or four iterations. Ratio P/A for a unit surface area of the active area is respectively 6.4, 8.5, and 11.4 for active areas 94, 96, and 98. FIGS. 12 and 17 show examples of active areas corresponding to surfaces with holes.

An embodiment of a manufacturing method providing optoelectronic device 5 comprises the steps of:

(1) Forming, on Surface 12 of Substrate 10, Seed Pads 16.

Seed pads 16 may be obtained by depositing a seed layer on surface 12 and by etching portions of the seed layer all the way to surface 12 of substrate 10 to delimit the seed pads. The seed layer may be deposited by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as atomic layer deposition (ALD). Further, methods such as evaporation or reactive cathode sputtering may be used.

When seed pads 16 are made of aluminum nitride, they may be substantially textured and have a preferred polarity. The texturing of pads 16 may be obtained by an additional treatment performed after the deposition of the seed layer. It for example is an anneal under an ammonia flow (NH3).

(2) Protecting the portions of surface 12 of substrate 10 which are not covered with seed pads 16 to avoid the subsequent growth of wires on these portions. This may be obtained by a nitriding step which causes the forming, at the surface of substrate 10, between seed pads 16, of silicon nitride regions (for example, SiN or Si3N4). This may also be obtained by a step of masking substrate 10 between seed pads 16, including the deposition of a layer, for example of a SiO2 or SiN or Si3N4 dielectric, and then the etching of this layer outside of seed pads 16 after a photolithography step. In this case, the masking layer may extend over seed pads 16. When the protection step (2) is carried out by a step of masking substrate 10, the seed layer etch step may be avoided. Seed pads 16 are then formed of a uniform continuous layer having its surface left free where the wires cross.

(3) Growing lower portion 22 of each wire 20 along height H2. Each wire 20 grows from the top of the underlying seed pad 16.

Wires 20 may be grown by a process of CVD, MOCVD, MBE, GSMBE, PAMBE, ALE, HVPE, ALD type. Further, electrochemical processes may be used, for example, chemical bath deposition (CBD), hydrothermal processes, liquid aerosol pyrolysis, or electrodeposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia (NH3), tertiarybutylphosphine (TBP), arsine (AsH3), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane (SiH4).

The presence of silane among precursor gases causes the incorporation of silicon within the GaN compound. A lower N-type doped portion 22 is thus obtained. This further translates as the forming of a silicon nitride layer, not shown, which covers the periphery of portion 22 of height H2, except for the top, as portion 22 grows.

(4) Growing upper portion 24 of height H3 of each wire 20 on the top of lower portion 22. For the growth of upper portion 24, the previously-described operating conditions of the MOCVD reactor are, as an example, maintained but for the fact that the silane flow in the reactor is decreased, for example, by a factor greater than or equal to 10, or stopped. Even when the silane flow is stopped, upper portion 24 may be N-type doped due to the diffusion in this active portion of dopants originating from the adjacent passivated portion or due to the residual doping of GaN.

(5) Forming insulating layer 26, for example, by conformal deposition of an insulating layer over the entire structure obtained at step (4) and etching this layer to expose upper portion 24 of each wire 20.

(6) Forming by epitaxy, for each wire 20, the layers forming shell 28. Given the presence of insulating layer 26 covering the periphery of lower portion 22, the deposition of the layers forming shell 28 only occurs on the upper portion 24 of wire 20 which is not covered with insulating layer 26;

(7) Forming electrode 30, for example, by conformal deposition;

(8) Forming conductive mirror layer 32 for example by physical vapor deposition (PVD) over the entire structure obtained at step (7) or for example by evaporation or by cathode sputtering and etching of this layer to expose each wire 20;

(9) Forming encapsulation layer 34. When encapsulation layer 34 is made of silicone, encapsulation layer 34 may be deposited by a spin coating deposition method, by an inkjet printing method, or by a silk-screening method. When encapsulation layer 34 is an oxide, it may be deposited by CVD; and

(10) Sawing substrate 10 to separate the optoelectronic devices.

In the previously-described embodiment, insulating layer 26 covers the entire periphery of lower portion 22 of each wire 20. As a variation, it is possible for a portion of lower portion 22 not to be covered with insulating layer 26. In this case, insulating layer 26 covers wire 20 up to a height smaller than H2 and shell 28 covers wire 20 up to a height greater than H3. It is possible for layer 26 not to cover lower portion 22 of each wire 20. In this case, shell 28 may cover each wire 20 up to height H1.

In the previously-described embodiment, insulating layer 26 does not cover the periphery of upper portion 24 of each wire 20. As a variation, insulating layer 26 may cover a portion of upper portion 24 of each wire 20. In this case, insulating layer 26 covers wire 20 up to a height greater than H2 and shell 28 covers wire 20 up to a height smaller than H3.

According to another variation, insulating layer 26 may, for each wire 20, partially cover the lower portion of shell 30.

According to a variation of the previously-described manufacturing method, the layers forming shell 28 may be formed before insulating layer 26 over the entire wire 20 or only over a portion of wire 20, for example, upper portion 24.

Specific embodiments of the present invention have been described. Various alterations and modifications will occur to those skilled in the art. Further, although, in the previously-described embodiments, each wire 20 comprises a passivated portion 22, at the base of the wire in contact with one of seed pads 16, passivated portion 22 may be absent.

Further, although embodiments have been described for an optoelectronic device for which shell 28 covers the top of the associated wire 20 and a portion of the lateral sides of wire 20, it is possible to only provide the shell at the top of wire 20.

Various embodiments with different variations have been described hereabove. It should be noted that those skilled in the art may combine various elements of these various embodiments and variations without showing any inventive step. In particular, optoelectronic device comprising an encapsulation layer having a refractive index in the range from 1.7 to 1.75 may, further, comprise a surface density of light-emitting diodes which is variable, as for example shown in FIG. 11. Further, the optoelectronic device comprising an encapsulation layer having a refractive index in the range from 1.7 to 1.75 may further have a ratio of the perimeter to the surface area of the active area which is greater than the ratio obtained for a square active area, for example as previously described in relation with FIGS. 12 to 20. Further, the optoelectronic device having a ratio of the perimeter to the surface of the active area which is greater than the ratio obtained for a square active area may further comprise a variable surface density of light-emitting diodes.

What is claimed:

1. An optoelectronic device comprising:
a semiconductor substrate having a surface; and
light-emitting diodes supported by the surface comprising wire-shaped, conical, or tapered semiconductor elements,
wherein the light-emitting diodes are distributed over a portion of the surface and the surface density of light-emitting diodes on the portion decreases away from the edges of said portion and wherein the ratio of the perimeter of said portion to the surface area of said portion is greater than or equal to 4 for a unit surface area.

2. The optoelectronic device of claim 1, wherein the portion corresponds to a surface with a hole.

3. The optoelectronic device of claim 1, wherein the light-emitting diodes are distributed over a portion of the surface and the surface density of light-emitting diodes on the portion decreases away from the edges of said portion.

4. The optoelectronic device of claim 1, further comprising an at least partially transparent dielectric layer covering the light-emitting diodes, the refractive index of the dielectric layer being in the range from 1.6 to 1.8, the maximum thickness of the dielectric layer being in the range from 250 nm to 50 μm.

5. The optoelectronic device of claim 4, wherein the refractive index of the dielectric layer is in the range from 1.7 to 1.75.

6. The optoelectronic device of claim 4, wherein the dielectric layer comprises a matrix made of a first at least partially transparent material having particles of a second material spread therein, the refractive index of the second material being greater than the refractive index of the first material.

7. The optoelectronic device of claim 6, wherein the first material is a polysiloxane.

8. The optoelectronic device of claim 6, wherein the second material is a dielectric material selected from among titanium oxide, zirconium oxide, and zinc sulfide.

9. The optoelectronic device of claim 4, wherein the dielectric layer is made of a material selected from the group comprising epoxide polymers, silicon oxides of SiOx type, where x is a real number greater than 0 and smaller than or equal to 2, silicon oxides of SiOyNz type, where y is a real number greater than 0 and smaller than or equal to 2 and z is greater than 0 and smaller than or equal to 0.57, and aluminum oxide.

10. The optoelectronic device of claim 1, wherein each semiconductor element is mainly made of a III-V compound.

11. The optoelectronic device of claim 10, wherein each semiconductor element mainly comprises gallium nitride.

12. The optoelectronic device of claim 1, wherein the mean diameter of each semiconductor element is in the range from 200 nm to 1 μm.

* * * * *

UNITED STATES PATENT AND TRADEMARK OFFICE
CERTIFICATE OF CORRECTION

PATENT NO. : 10,177,288 B2
APPLICATION NO. : 15/933135
DATED : January 8, 2019
INVENTOR(S) : Tiphaine Dupont et al.

It is certified that error appears in the above-identified patent and that said Letters Patent is hereby corrected as shown below:

On the Title Page

At item (73) Assignees: "Commissariat à l'Énergie Atomique et aux Énergies Alternatives, Paris (FR); Aledia, Grenoble (FR)" should read --Aledia, Gronoble (FR)--.

Signed and Sealed this
Twenty-second Day of October, 2019

Andrei Iancu
*Director of the United States Patent and Trademark Office*